United States Patent [19]

Wojcik

[11] 4,376,505
[45] Mar. 15, 1983

[54] METHODS FOR APPLYING SOLDER TO AN ARTICLE

[75] Inventor: Thaddeus Wojcik, Hopewell Township, Mercer County, N.J.

[73] Assignee: Western Electric Co., Inc., New York, N.Y.

[21] Appl. No.: 222,439

[22] Filed: Jan. 5, 1981

[51] Int. Cl.³ .......................................... H01L 21/60
[52] U.S. Cl. ............................. 228/215; 228/180 A; 228/246
[58] Field of Search ................... 228/180 A, 214, 215, 228/246, 248

[56] References Cited

U.S. PATENT DOCUMENTS

| | | | |
|---|---|---|---|
| 1,572,921 | 2/1926 | Gizienski | 228/214 |
| 2,941,067 | 6/1960 | Kitrell | 219/125 |
| 3,589,000 | 6/1971 | Galli | 228/180 A X |
| 3,719,981 | 3/1973 | Steitz | 228/215 X |
| 4,238,528 | 12/1980 | Angelo et al. | 228/214 X |
| 4,268,585 | 5/1981 | Daur et al. | 228/180 A X |
| 4,273,859 | 6/1981 | Mones et al. | 228/180 A X |

FOREIGN PATENT DOCUMENTS 55-115344  9/1980  Japan ............................. 228/180 A Primary Examiner—Kenneth J. Ramsey
Attorney, Agent, or Firm—D. J. Kirk

[57] ABSTRACT

A thick solder blob (56) is bonded to a land area 34 on a metallized substrate (31) by (a) depositing a thick layer of solder paste on the land area; (b) confining the solder paste with a hard material; and (c) reflowing the solder paste to bond the solder blob (56) to the land area (34) while maintaining the thickness thereof.

3 Claims, 7 Drawing Figures

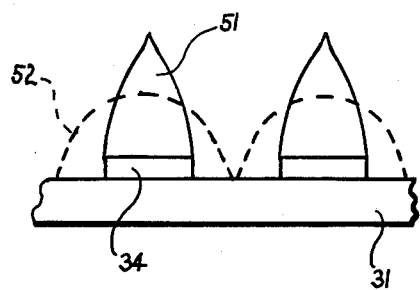
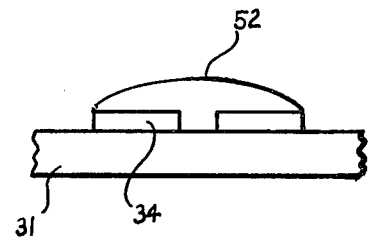
FIG. 4  FIG. 5
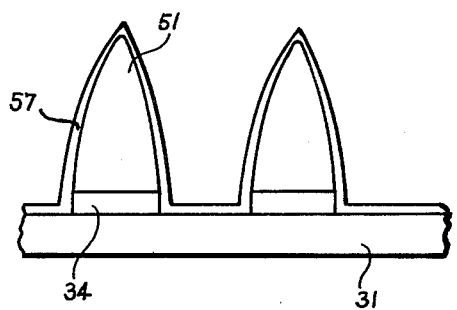
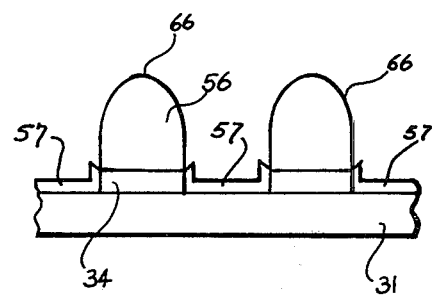
FIG. 6  FIG. 7

METHODS FOR APPLYING SOLDER TO AN ARTICLE

TECHNICAL FIELD

The instant invention is related to application of solder to articles. In particular, the invention is directed to applying solder to selected conductive areas of metallized substrates.

BACKGROUND OF THE INVENTION

In recent years "chip carriers" have emerged as a promising high-volume device packaging technique. In one simple form a chip carrier is a substantially square, relatively thin, plastic article having a cavity with bonding pads therein which are connected by a plurality of electrically conductive paths that extend through walls thereof, along the side walls, and terminate on the underside of the carrier. The conductive paths may be metallic wire leads or they may be electroplated thereon, the former is referred to as a "leaded" while the latter has been termed a "leadless" chip carrier. A semiconductor circuit chip is placed in the cavity, electrically connected to the bonding pads, and a cover placed over the cavity which may be used to hermetically seal the chip therein.

The chip carrier may be soldered to an electrically conductive land area array on the surface of a Printed Circuit Board (PCB), a metallized ceramic substrate or the like. Solder paste is screen printed on the land area array and then reflowed to form a bonded solder coating on each land area in the array. The leads on the underside of the chip carrier are then placed in mated contact with the solder coated land areas and the solder reflowed to effect a bond therebetween. Condensation soldering, various belt furnaces and hot gas apparatus have proven effective for soldering the chip carriers to the conductive land areas arrays.

It has been found necessary to maintain a gap of at least 0.010 inch between the bottom surface of the chip carrier and the PCB or other substrate surface to provide for efficient and complete flux removal and for the subsequent application of encapsulant under the carrier to protect conductors, crossovers, etc. When leaded chip carriers are used such a distance is simply obtained due to the wire lead itself which is bent about, and slightly spaced from the bottom surface of the carrier. However, use of the leadless chip carrier presents a problem due to the fact that the plated leads (e.g., gold plated over nickel) are extremely thin (e.g., 0.0016 inch) and provide substantially no spacing between the bottom of the chip carrier and the substrate.

Accordingly, the gap between the bottom surface of the leadless chip carrier and the substrate surface is governed by the height of the solder coating bonded on the land areas. Thus, the gap can be increased by increasing the height of the solder coating. System designs wherein leadless chip carriers would be soldered directly to the substrates introduce two additional reasons for maximizing the height of the solder coating. First, the solder bonding the land areas to the chip carrier leads become the compliant member which must withstand the stresses induced by the mismatch of the coefficients of thermal expansion between the chip carrier material and the substrate material. Secondly, the solder joint must accommodate the stresses caused by flexing of the PWB during manufacture or by the insertion of boards into cardguides and connectors of equipment enclosures.

One technique that has been suggested to increase the height of the solder on the land area is to dispense or stencil print very thick layers thereon and then reflow the paste to bond a thick blob of solder thereto. However, problems arise when the solder paste reflows for its height substantially decreases and the solder laterally disperses, undesirably resulting in solder bridges or shorts.

Accordingly, there is a need for a technique for increasing the height of the solder which is bonded to land areas of metallized substrate.

SUMMARY OF THE INVENTION

The instant method overcomes the foregoing problem of forming thick amounts of solder on conductive portions of a metallized substrate. The method comprises the steps of forming a thick blob of cured solder paste on the conductive portion; applying a hard coating to confine the thick blob of cured solder paste; reflowing the cured solder blob, while confined, to bond the solder to the conductive portion; and removing the hard coating.

BRIEF DESCRIPTION OF THE DRAWINGS

FIG. 4 depicts the reflow pattern of thick solder paste deposited on land areas of a metallized substrate;
FIG. 5 represents undesirable bridging between adjacent land areas of a metallized substrate;
FIG. 6 depicts thick blobs of cured solder paste having a confining coating thereon;
and
FIG. 7 shows thick solder blobs bonded to lands of a metallized substrate.

DETAILED DESCRIPTION

Figure 1:
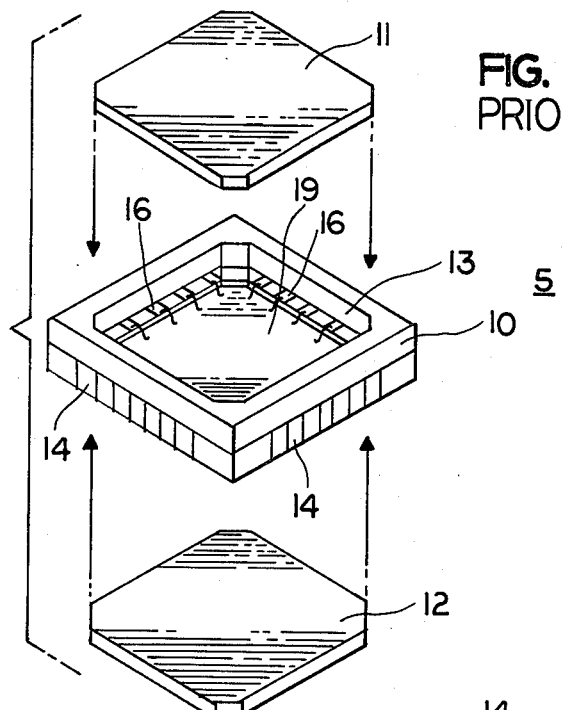
FIG. 1 is an exploded view of a chip carrier.

FIG. 1 is an exploded view of a typical leadless chip carrier device, generally designated by the numeral 5, which is well known in the art. The chip carrier 5 is comprised of a plastic body portion 10 having top and bottom caps 11 and 12, respectively, which enclose a cavity 13.

Figure 2:
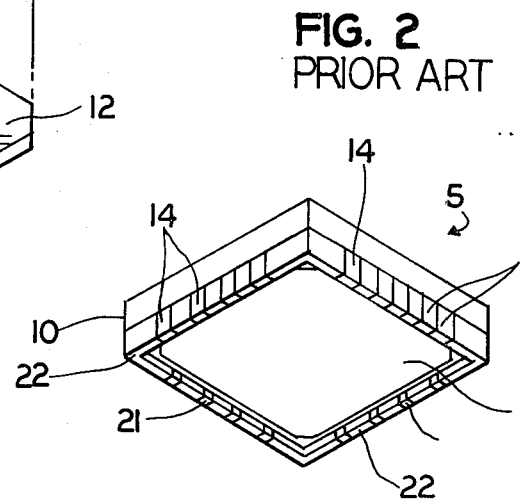
FIG. 2 is an isometric bottom view of a chip carrier.

A plurality of electroplated conductive leads 14—14 extend through the body portion 10 and have first ends 16—16 located within the cavity 13 which are wire bonded to a semiconductor chip 19 mounted therein. Second ends 21—21 of the leads 14—14 project through the outside of the body portion 10 and are plated under the bottom surface 22 of the body portion as can be seen in the isometric view of the bottom of the chip carrier 5 shown in FIG. 2.

Figure 3:
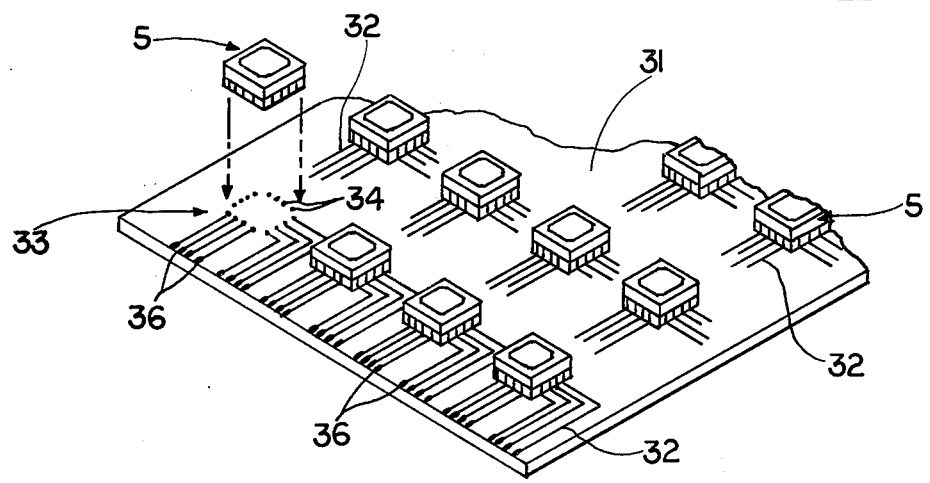
FIG. 3 is an isometric view of a metallized substrate having a plurality of chip carriers soldered thereto.

In a particular application, shown in FIG. 3, a plurality of leadless chip carriers 5—5 are bonded to an insulative substrate 31 having metallized circuit patterns 32 thereon. The substrate 31 has a multitude of land area arrays, generally indicated by the numeral 33, the array comprising a plurality of presoldered land areas 34—34 geometrically arranged in a pattern that can mate with the second ends 21—21 of leads 14—14 on the chip carrier 5. The conductive circuit paths 32—32 form electrical connections between land areas 34—34, between other arrays 33—33 and/or metallized contact fingers 36—36 located proximate the edge of the substrate 31.

As hereinbefore indicated, it is most important, at times, to provide as much distance as possible between the bottom portion 12 of the chip carrier 5 and the surface of the substrate 31. One technique is to place a relatively thick blob of solder paste 51 on the metallic land area 34 as shown in FIG. 4. Unfortunately, as heat is applied to form a solder bond with the land area 34 the blob of solder paste 51 tends to flow laterally from the lands areas forming solder mounds having a height of about 0.014 inch indicated by the dashed lines 52—52 which, undesirably, will further decrease when the solder is again reflowed to bond the carrier 5 thereto. Furthermore, when the land areas 34—34 are closely spaced as shown in FIG. 5 bridging or shorting can occur between the land areas resulting in unacceptable product.

The instant invention provides a technique for forming a thick, high volume, solder blob 56 (see FIG. 7) on the land areas 34—34 or other conductive portions of a metallized substrate. The blobs of solder paste 51—51 are deposited on the metallic land areas 34—34 (see FIG. 3) and heat cured, to boil off volatile solvents therein to harden the paste. The cured blobs of solder paste 51—51 are then coated with a thin layer of a hard, heat transmissive material 57 as shown in FIG. 6.

The cured blobs of solder paste 51—51 are then exposed to elevated temperatures, while still confined within the hard material 56, to reflow the blobs of solder paste, forming a solder bond to the land areas 34—34. The coating 57 is then removed leaving the thick, upstanding, solder blob 56 as shown in FIG. 7.

In a specific exemplary embodiment a solder paste type RMA 321-85-2-50 manufactured by Alpha Metals Inc., was dispensed as an array 33 (see FIG. 3) on copper land areas 34—34 of a PCB 31 through a multiapertured nozzle. However, the blobs of solder paste 51—51 may be deposited on an individual basis with any well known paste dispensing apparatus. Each blob of solder paste 51 was approximately 0.020 by 0.055 inch at its base and exceeded 0.050 mils in height. The PWB 31 with the blobs of solder paste 51—51 thereon was then placed in a forced hot air oven at 112° F. for one hour to drive off volatile solvents from the paste and to harden the paste.

Following removal from the oven the PWB 31 with the blobs of cured solder paste 51—51 thereon was coated with a type PC401 Green solder mask material 57 manufactured by PCK Technology, Division of Kollmogen Corporation, as shown in FIG. 6. The solder mask material 57 is such that it becomes hard when cured by heating. The mask material 57 was diluted with Butyl Acetate solvent to adjust the viscosity thereof for air spraying. A first coating 57 of approximately 0.001 inch in thickness was sprayed over the entire surface of the PWB 31 and the blobs of cured blobs of solder paste 51—51. The coated PWB 31 was then placed in the forced hot air oven at 112° F. for one hour resulting in a partially cured tacky coating. A second spray coating having a thickness of about 0.001 inch was applied and the oven curing cycle repeated whereupon the coating 57 became hardened.

The PWB 31 with the hardened coating 57 confining each cured blob of solder paste 51 in an upstanding position therein (see FIG. 6) was then immersed in hot saturated vapor within a condensation soldering facility as described in U.S. Pat. No. 3,904,102 to Chu et al., which disclosure is incorporated by reference herein. The immersion lasted for 42 seconds at 419° F. to reflow each blob of solder paste 51 to bond the solder blobs 56—56 on the land areas 34—34. The coating 57 was then removed by brushing lightly with a hard wire brush. Advantageously, as shown in FIG. 7, portions of the coating material 57—57 remain on the surface of the substrate 31 to provide protection for the substrate and the conductive paths 32—32 thereon. Alternatively, the coating 57 may be removed by placing the PWB 31 in a vapor degreasing facility and applying a solvent such as that sold under the trademark Freon TMS by E. I. duPont DeNemours thereto. Preferably, both techniques are used to insure proper removal of the coating 57.

The resulting solder blobs 56—56, as shown in FIG. 7 remain upstanding with rounded top portions 66—66 and the overall height is only slightly less after the reflow operation due to solder flux leaving the solder paste. However, the resulting height was approximately 0.030 inch will no lateral spreading of the solder. Such increased height advantageously provides the heretofore mentioned required spacing between the chip carrier 5 and the surface of the PWB 31 while precluding shorts and permitting closer spacings between arrays 33 of land areas 34—34.

It is to be understood that the embodiments described herein are merely illustrative of the principles of the invention. Various modifications may be made thereto by persons skilled in the art which embody the principles of the invention and fall within the spirit and scope thereof. In particular, it should be clear to one of ordinary skill in the art that the solder blobs 56—56 may be formed on the ends 21—21 of the leads 14—14 and/or the land areas 34—34.

What is claimed is:

1. A method of forming a thick deposit of solder on an electrically conductive portion of a metallized substrate, the method comprising the steps of:
   (a) forming a thick layer of cured solder paste on the conductive portion;
   (b) applying a hard coating over said cured solder paste to confine the thick layer of cured solder paste;
   (c) reflowing the solder, while confined, to bond the solder to the conductive portion; and
   (d) removing the hard confining coating.

2. A method of forming a thick deposit of solder on an electrically conductive portion of a metallized substrate, the method comprising the steps of:
   (a) depositing a thick layer of solder paste on the conductive portion;
   (b) subjecting the thick layer of solder paste to an elevated temperature to cure said paste;
   (c) applying a hardenable coating to the cured solder paste;
   (d) hardening the coating;
   (e) reflowing the solder, while confined within the hardened coating, to bond the solder to the conductive portion; and
   (f) removing the hard coating.

3. A method of bonding a thick, upstanding, solder blob on an electrically conductive land area of a metallized substrate, the method comprising the steps of:
   (a) depositing a thick, upstanding, solder paste blob on the land area;
   (b) curing the solder paste blob at an elevated temperature for a predetermined time;
   (c) coating the solder paste blob with a hardenable material;
   (d) curing the coating to harden the material;
   (e) reflowing the coated solder to bond the solder blob to the land area; and
   (f) removing the hardened coating, leaving a thick upstanding solder blob bonded to the land area.

* * * * *